US 8,145,458 B1

(12) United States Patent
Kukal et al.

(10) Patent No.: US 8,145,458 B1
(45) Date of Patent: Mar. 27, 2012

(54) METHOD AND SYSTEM FOR AUTOMATIC STRESS ANALYSIS OF ANALOG COMPONENTS IN DIGITAL ELECTRONIC CIRCUIT

(75) Inventors: Taranjit Singh Kukal, Delhi (IN); Sankaran Dharmarajan, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 919 days.

(21) Appl. No.: 11/785,603

(22) Filed: Apr. 19, 2007

(51) Int. Cl.
*G06G 7/48* (2006.01)

(52) U.S. Cl. .......................................... 703/4

(58) Field of Classification Search .................. 703/4
See application file for complete search history.

(56) References Cited

U.S. PATENT DOCUMENTS

| | | | | |
|---|---|---|---|---|
| 6,212,490 | B1* | 4/2001 | Li et al. | 703/14 |
| 6,237,117 | B1* | 5/2001 | Krishnamoorthy | 714/724 |
| 6,601,220 | B1* | 7/2003 | Allen et al. | 716/4 |
| 6,792,579 | B2* | 9/2004 | Rankin | 716/3 |
| 2002/0188915 | A1* | 12/2002 | Hayes | 716/4 |
| 2007/0006103 | A1* | 1/2007 | Zhang et al. | 716/1 |

OTHER PUBLICATIONS

Kaushik Vaidyanathan et al., "Empowering ASIC front-end to meet the challenges of the ultra deep sub-micrometer", Feb. 22, 2007, International Conference on Signal Processing, Communications and Networking, pp. 392-397.*

Premal Buch et al., "Symphony: a fast mixed signal simulator for BiMOS analog/digital circuits", 1996, 10th International Conference on VLSI design, pp. 403-407.*
Ying Wang et al., "The development of analog SPICE behavioral model based on IBIS model", 1999, Proceedings of the Ninth Great Lakes Symposium on VLSI, four unnumbered pages.*
Intusoft Newsletter, Jun. 2004, issue 74, Intusoft, pp. 1-16.*
Mircea I. Mihaiu et al., "Electronic designs verification by worst case circuit analysis method," 2005, The International Symposium on System Theory, Automation, Robotics, Computers, Informatics, Electronics and Instrumentation, four pages.*
Zbyna, "PSpice Studio—advanced simulation solutions for analog and mixed-signal environments," 2004, http://hw-server.com/software/pspicest.html, pp. 1-6.*
Micron, "Technical Note IBIS Behavioral Models," 1996, Micron Technology, pp. 1-6.*

* cited by examiner

*Primary Examiner* — Paul Rodriguez
*Assistant Examiner* — Russ Guill
(74) *Attorney, Agent, or Firm* — Rosenberg, Klein & Lee

(57) ABSTRACT

An automated approach is provided for evaluating stress upon analog components embedded in a digital electronic circuit design. The approach includes establishing a computer readable circuit definition of the digital electronic circuit design. The circuit definition is then partitioned into a plurality of circuit portions, which are re-defined to form a plurality of analog topologies. The analog topologies are adapted for automatic analog simulation one independent of the other, with all digital components substituted by at least one subcircuit including instantiation of a corresponding input output (IO) buffer model. Automatic analog simulation is carried out upon the analog topologies to generate simulated results data, which are automatically postprocessed to generate worst-case stress measurement data for one or more critical components identified in the analog topologies.

20 Claims, 8 Drawing Sheets

METHOD AND SYSTEM FOR AUTOMATIC STRESS ANALYSIS OF ANALOG COMPONENTS IN DIGITAL ELECTRONIC CIRCUIT

BACKGROUND OF THE INVENTION

Field of the Invention

The subject method and system for automatic stress analysis of analog components in a digital electronic circuit is generally directed to the optimization of a digital electronic circuit design prior to physical implementation. More specifically, the method and system provides automatic estimates of the actual 'stress' that analog components embedded in a digital electronic circuit would be subjected to during actual operation, so as to enhance the circuit's reliable operation upon physical implementation in a printed circuit board (PCB) or the like.

In carrying out such physical electronic circuit implementations as PCBs, the desired electronic circuit is schematically defined once it is conceptually designed. For digital electronic circuits, this schematic definition invariably includes not only pre-packaged integrated circuit (IC) devices with manufacturer-defined interconnection pins, but also discretely embedded analog components such as resistors, capacitors, inductors, bipolar junction transistors, field effect transistors, diodes, resistor packs, analog ICs, and voltage-regulator type ICs.

The analog components discretely scattered throughout even digital electronic circuits is typically quite numerous. Passive elements (such as resistors, capacitors, inductors, varistors, . . . ) as well as active devices (such as diodes, Zener diodes, transistors, operational amplifiers, comparators, regulators, . . . ) are often included in digital circuit designs to serve essential functions. In some designs, for example, the analog components may provide terminations to address signal integrity problems; capacitive bypass for noise filtering; transistor circuitry to drive sensors; voltage regulation and biasing circuitry for certain IC devices; or, varistor and capacitor elements for noise and surge suppression.

These discrete analog components bear significantly on the electronic circuit's reliability, as they are subject to 'stress' in actual operation. That is, the components may be subject to such things as excessive voltage, excessive current, excessive power-dissipation, excessive temperature levels (beyond the safely-rated limits set by their manufacturers), and/or secondary breakdown under potential operating conditions of the circuit. Indeed, the prevalence of discrete analog components in digital circuit designs makes their reliability testing quite important in accurately assessing the robustness of the overall design. Potential sources of catastrophic circuit failure due to excessively unsafe operating levels in these discrete analog components would otherwise go unaccounted for.

There is therefore a need for an automated approach whereby the stress to be encountered by analog components embedded within digital electronic circuit designs may be accurately and comprehensively analyzed. There is a need for such automated approach which may be simply adapted for use even with simulation and analysis tools which are known and readily available.

PRIOR ART

Automated testing and/or verification techniques exclusively for digital designs as well as those exclusively for analog designs are known. Similar techniques for the automatic testing and/or verification of analog components discretely embedded in digital design are not heretofore known, however, at least not without either undue complexity or gross oversimplification.

Hardware description language (HDL) simulations normally carried out for digital electronic circuit designs functionally verify the logic operably defined by the digital devices of the circuit such as memories, micro-controllers, combinatorial and sequential logic devices, and the like. These HDL simulations, however, fail to test or verify the operation of the circuit's discretely embedded analog components. On the other hand, simulation tools such as SPICE (Simulation Program with Integrated Circuit Emphasis) are normally applied to analog circuit designs. Stress analysis tools are available in that case to postprocess the resulting data and automatically analyze stress on the circuit's discrete components (based upon pre-stored library information). An example of such stress analysis tools is the SMOKE analysis tool available from Cadence Design Systems, Inc. of San Jose, Calif.

The simulation and stress analysis tools available for analog simulation and analysis cannot be applied presently for discrete analog components which are embedded in digital electronic circuit designs. A hybrid approach using a mix-signal simulation tool, for instance, to conduct co-simulation is possible, but such co-simulation requires HDL models for the circuit's various digital devices to be developed. Not only are HDL models very difficult to fully obtain for board level simulation, the modeling of supplemental interface elements (such as analog-to-digital and digital-to-analog converters) is also required to facilitate the mix-signal simulation that would occur. These and other obstacles make the co-simulation techniques known in the art prohibitively expensive for most applications, both in cost and computational load.

Circuit designers are often relegated, therefore, to manual calculations for limited verification of operation within safe ranges. Aside from yielding at best gross estimations, the practical limitations on such manual approach are many. First, it is much too cumbersome and time consuming to perform manual calculations to cover even a meaningful set of the components at hand, let alone all of them. The calculations must therefore be limited to only select groups of components assumed to be the most critical. Moreover, the information that may be gleaned from the calculations are far from comprehensive, as manual calculations are practicable only for steady state, or DC, operating conditions, which presume no stimulus to the circuit. Transient conditions—which often pose the greatest threat to reliability—cannot be adequately analyzed by hand, at least not without gross approximations based on DC conditions.

An example of the challenges confronting the manual calculation approach is illustrated with reference to FIG. 1, which schematically illustrates a simple example of a circuit design portion having both digital and analog components 2, 4. The IC device U5 making up the digital component 2 in this example is connected by its interconnection pin D7 to a resistor R1 of the elements/devices making up the analog components 4. Power dissipation through the resistor R3 would be calculated under DC conditions as follows:

$$P_{R3} = I_{R3}^2 \times R3 = [(\text{VCC\_ARROW} - V_{D1} - VCE_{sat})/(R3 + R2)]^2 \times R3$$

where,
$V_{D1}$ is the characteristic voltage drop through diode D1, and $VCE_{sat}$ is the collector-emitter saturation voltage of the bipolar
junction transistor Q1 when it is conducting in the ON state.

The calculation is carried out on the assumption that the bipolar junction transistor (BJT) Q1 is in fact operating in its conductive ON state, and that its $VCE_{sat}$ is readily known. The calculation also assumes that the conventional approximation for the diode drop voltage $V_{D1}$ (of 0.4V, for example) is valid.

In order to determine the worst case stress that resistor R3 is subjected to, the calculation must be carried out with offsets in operating conditions appropriately tailored to adequately span the combined tolerance ranges of the given components. For example, resistance R2 is taken for the purposes of this calculation to be of the lowest value in its tolerance range, the resistance R3 is taken to be of the highest value in its tolerance range, and the voltage VCC_ARROW is likewise taken to be of the highest value in its tolerance range.

The combination of tolerance conditions (and the tolerance direction, to maximum or minimum limit for worst case conditions) taken for the given components in this manner will vary with the given topology of the design, and with the nature of the tolerances and measurements involved. Given that in many digital electronic circuit designs the number of discretely embedded analog components is often in the thousands, accounting for the components' respective tolerances alone increases the computational load quite exponentially. Compounding the burden all the more are such actual factors as the variable derating of parameters like power dissipation capability with rise in component temperature. These cannot be adequately accounted for by manual means.

SUMMARY OF THE INVENTION

A primary object of the present invention is to provide a method and system whereby the stress to be encountered by analog components embedded within digital electronic circuit designs may be accurately and comprehensively analyzed.

It is another object of the present invention to provide an automated method and system which may be simply adapted for use even with simulation and analysis tools which are known and readily available.

It is yet another object of the present invention to provide an automated method and system wherein a digital electronic circuit design is effectively decomposed into a plurality of analog topologies adapted for independent analog simulation.

These and other objects are attained in a method and system provided in accordance with certain embodiments of the present invention for automatically evaluating stress upon analog components in a digital electronic circuit design. The method includes establishing a computer readable circuit definition of the digital electronic circuit design. The circuit definition is then partitioned into a plurality of circuit portions, which are re-defined to form a plurality of analog topologies. The analog topologies are adapted for automatic analog simulation one independent of the other, with all digital components substituted by at least one subcircuit including instantiation of a corresponding input output (IO) buffer model. Automatic analog simulation is carried out upon the analog topologies to generate simulated results data, which are automatically postprocessed to generate worst-case stress measurement data for one or more critical components identified in the analog topologies.

An exemplary system embodying the method includes a circuit definition unit operable to generate a computer readable circuit definition of the digital electronic circuit design. A circuit re-definition unit is coupled to the circuit definition unit operable to partition the circuit definition into a plurality of circuit portions, which are re-defined to form a plurality of analog topologies adapted for automatic analog simulation one independent of the other. The circuit re-definition unit selectively substitutes all digital components in each circuit portion with at least one subcircuit including instantiation of an input output (IO) buffer model corresponding thereto. A simulation unit coupled to the circuit re-definition unit is operable to then execute automatic analog simulation upon the analog topologies to generate simulated results data. A stress analysis unit is coupled to the simulation unit for automatically postprocessing the simulated results data to generate worst-case stress measurement data for one or more critical components identified in the analog topologies.

DESCRIPTION OF THE PREFERRED EMBODIMENTS

As used herein, the term maximum operating condition (MOC) refers to the extreme levels potentially encountered during operation for various operational parameters such as "maximum temperature," "maximum power-dissipation," and the like. The term technology used in connection with a particular device refers to "ECL," "LSTTL," "CMOS," or other such classifications known in the art relating to the physics of the device. The term analog topology refers to a particular portion of the given electronic circuit sufficiently self-contained that it may be treated for simulation purposes in a manner independent of the other circuit portions, and which preferably terminates at a digital device (or an IO buffer representation thereof), a bias point (for example VCC or ground), or a floating node.

In accordance with one aspect of the present invention, an automated approach is realized whereby stress measurements for analog components embedded within digital electronic circuit designs may be accurately and comprehensively obtained. The approach enables the use of readily available analog simulation and stress analysis tools to compute the measurements, preferably taking into account both transient and steady state behavior.

In broad concept, the subject method and system effectively decomposes a computer readable description of a digital electronic circuit design into a plurality of parts on which analog simulation may be independently executed for subsequent postprocessing of results. This not only breaks down the computational load brought to bear on each part, it permits the use of existing analog simulation and postprocessing analysis tools for the required testing and verification. This also permits the use of multiple processing systems for parallel application of the tools on the different parts of the circuit design.

Preferably, the given circuit design is described by netlists or other computer readable means known in the art. Where the design is sufficiently large or complex, it is partitioned into a plurality of circuit portions. These circuit portions are re-defined for the purposes of simulation and analysis into respective analog topologies which are subject to analog simulation one independent of the other. The circuit definition is then partitioned into circuit portions described by partial netlists; and, any digital devices contained in those circuit portions are effectively replaced with subcircuits containing appropriately configured input output (IO) buffer instantiations which effectively model the digital device's behavior in parametric terms pertinent to the analog components coupled thereto. The analog topologies that result are substantially analog in nature, such that SPICE, SMOKE, and other such automated simulation/analysis tools known in the art may be applied to carry out the required reliability testing and verification.

Figure 1:
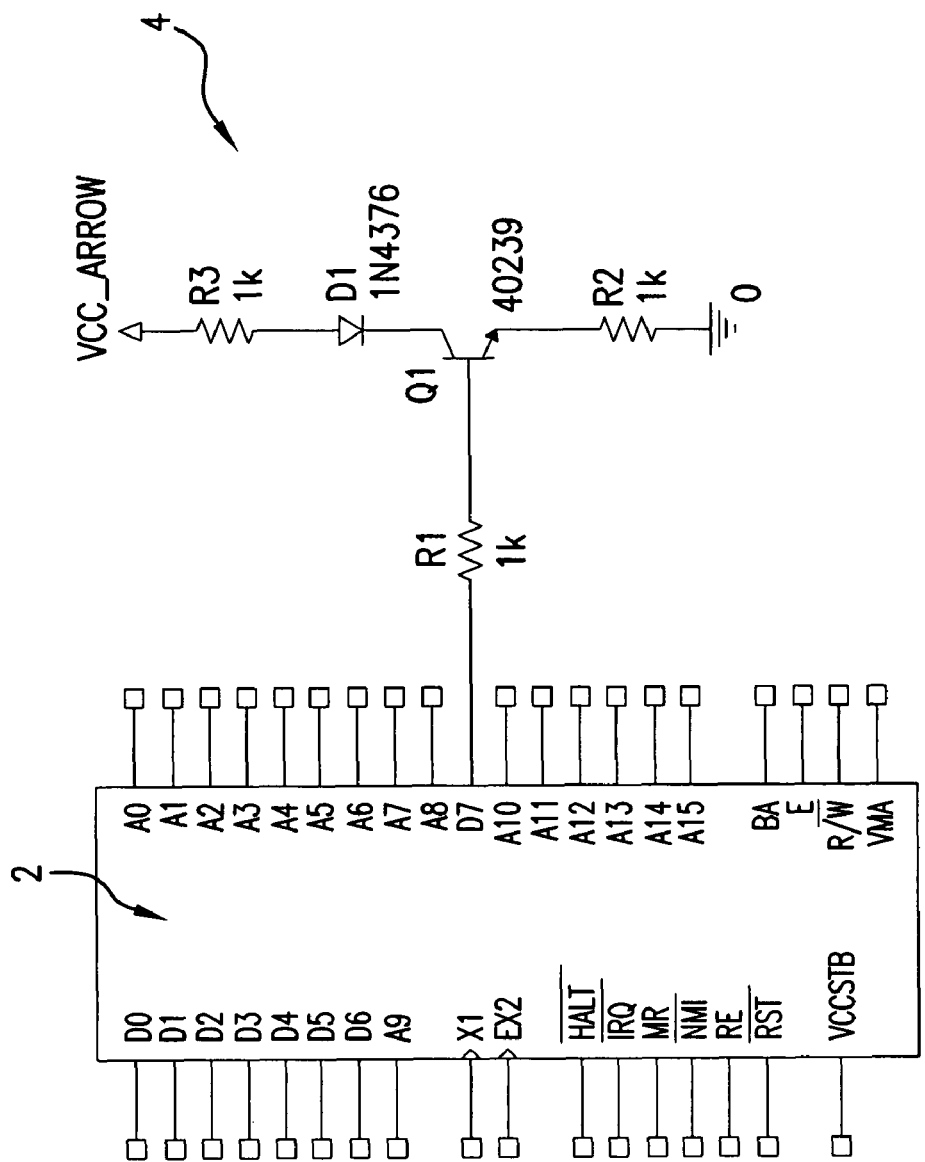
FIG. 1 is a schematic diagram illustrating an example of a digital electronic circuit portion.
Figure 2:
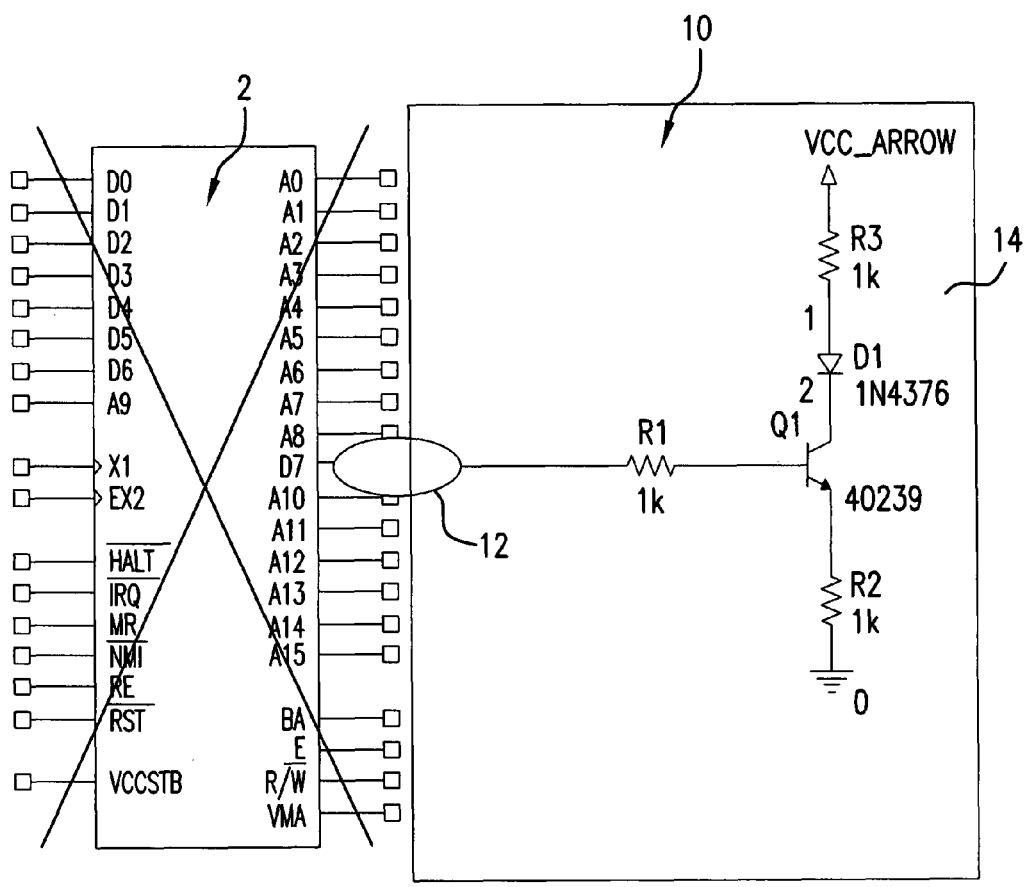
FIG. 2 is a schematic diagram illustrating a circuit portion re-definition process in accordance with one embodiment of the present invention.
Figure 3:
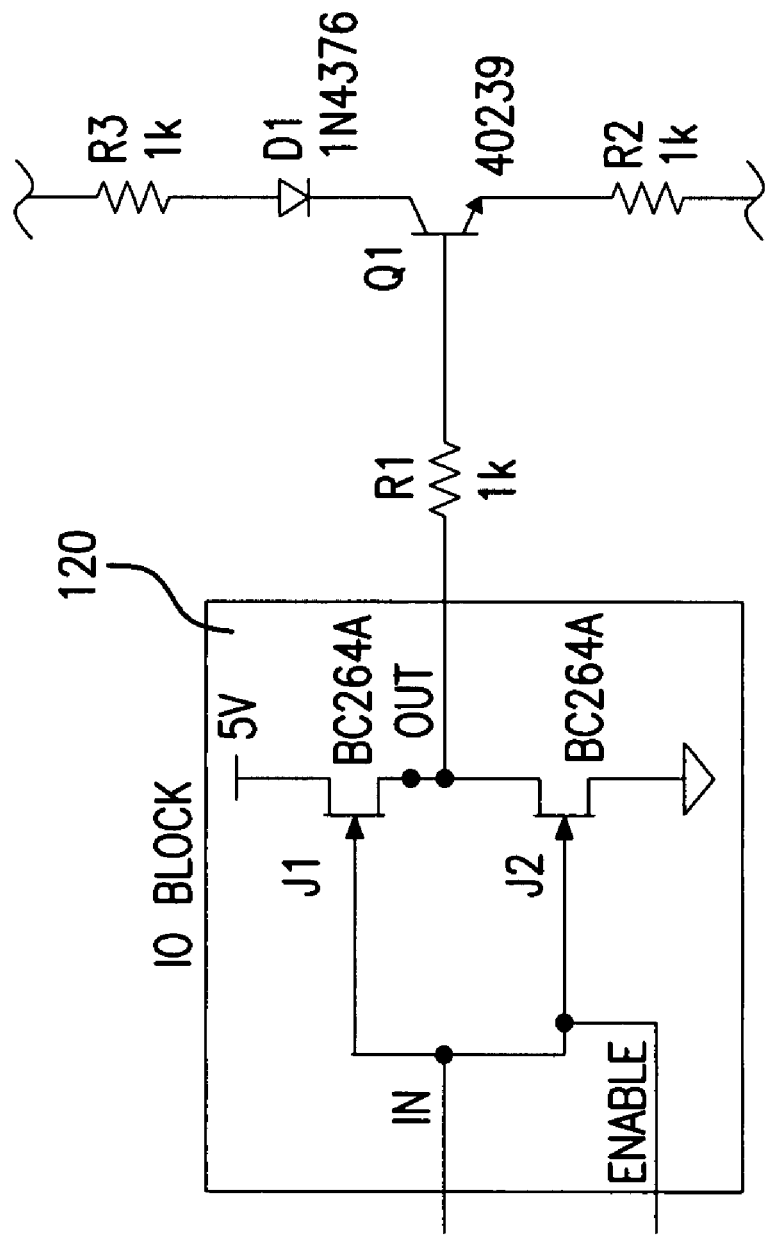
FIG. 3 is a schematic diagram, partially cut away, illustrating by example a subcircuit incorporated in the process of FIG. 2.

Referring now to FIGS. 1-3, the simple circuit portion illustrated in FIG. 1 contains digital and analog components 2, 4. The circuit portion in this illustration is sufficiently simple that its further partitioning is not necessary. The circuit portion may be re-defined in accordance with one embodiment of the present invention to the analog topology 10 illustrated in FIG. 2. While the analog components 14 of this topology 10 remain unchanged from their representations 4 in FIG. 1, the digital component 2 is replaced by a subcircuit containing an IO buffer model 12 at the pin of the device U5 which connects to the resistor R1, namely pin D7. The substitution exploits the fact that digital devices generally interface with surrounding circuitry through IO buffers for driving or sinking currents passing therebetween, recognizing that the stress encountered by analog components in the surrounding circuitry derive substantially as a function of the driving currents and voltages from such IO buffers.

As further illustrated in FIG. 3, the IO buffer 12 may be implemented in accordance with an exemplary embodiment of the present invention within an IO buffer block subcircuit 120 of suitable configuration. One or more IO buffer block subcircuits suitably configured for the substituted digital component may be employed, depending on the particularities of the intended application. Considerations such as fan-out, the extent and nature of the load to be driven, selected IO buffer technology, and the like preferably bear on the choice of IO buffer configuration.

Analog simulation may progress upon the resulting analog topology, apart analog topologies similarly formed for other parts of the given circuit. In contrast, the alternate approach of merely performing co-simulation directly upon just the circuit portion of FIG. 1 would present a much more complex undertaking. It would necessitate an HDL model for device U5, as well as an A/D converter at pin D7 of that device, with a separate SPICE model for resistor R1. An appropriately-configured HDL test-vector would also be needed to trigger the HDL model of device U5 for simulation.

The IO buffer block 120 illustrated in the re-defined analog topology preferably affords the use of existing analog simulation tools. Aside from obviating the need for an HDL model of device U5 in this regard, block 120 obviates the need for any elaborate test-vectoring. The IO buffering function that it models may be triggered as needed by suitably controlling, for example, the IN and ENABLE pins of block 120. With the IO buffer block 120 properly enabled, a pulsed signal at the IN pin could be switched in such manner that all possible combinations may be covered for the given circuit's frequency of operation so that sufficient simulation data is available for comprehensive stress analysis of the discrete components in the analog topology.

Figure 4A:
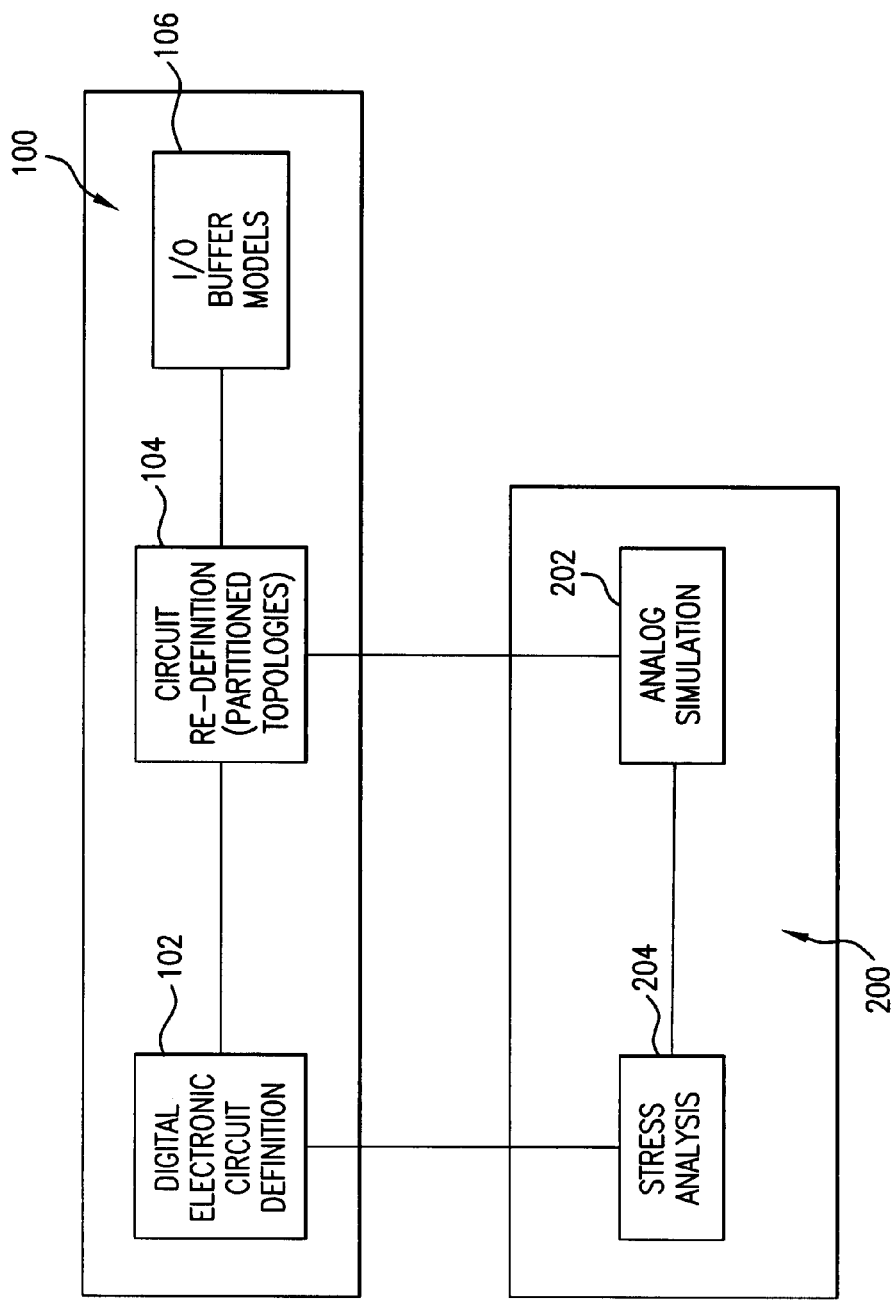
FIG. 4A is a block diagram illustrating a system formed in accordance with one exemplary embodiment of the present invention.

Referring now to FIG. 4A, there is shown a simplified block diagram broadly illustrating the operational coupling of functional units in a system realized in accordance with an exemplary embodiment of the present invention. As shown, a circuit definition portion 100 includes a digital electronic circuit definition unit 102 equipped with suitable measures known in the art for obtaining the required level of netlist definition, for instance, of the given circuit. If the circuit design is sufficiently large, it is preferably broken down for simulation and analysis purposes into a plurality of circuit portions, using any suitable partial netlisting technique known in the art. A circuit topology re-definition unit 104 operates on the circuit portions to replace the digital components with subcircuits containing appropriately configured IO buffer instantiations. The circuit portions are thereby re-defined to substantially analog form (analog topologies) and accordingly processed by an analog simulation unit 202 within a testing portion 200 of the system. The analog simulation unit 202 is sufficiently equipped with suitable simulation measures known in the art to obtain operational data for transient state operation as well as for steady state operation. The results of this analog simulation are then processed by a stress analysis unit 204 using suitable known measures. The integrity of circuit operation and reliability of its components are thus tested under both steady state and transient conditions. If necessary, the circuit designer may then use the results for updated synthesis of the given circuit design.

Referring to 4B, there is shown a flow diagram illustrating by example a sequence of operations carried out in accordance with one embodiment of the present invention. At block 302, the given design's definition is updated with predefined properties to reflect, among other things, the maximum operating condition(s) (MOC) of concern, in accordance with the technologies of the given devices. In an illustrative embodiment employing such stress analysis tools as the SMOKE analysis tool, the digital electronic circuit design definition is preferably updated with such information as:

1. A Type designation for each discrete device under test. This information classifies the category of SMOKE-tests to be performed and identifies the related parameters.
2. Identification of the SMOKE-Tests specifically required for the given discrete device under test. An example of stress-test definitions for devices, and their mapping to device terminals is shown in Table 1.
3. Identification of the Test-Pins of the device involved in a particular test. For example, the collector and emitter pins of a BJT device would be involved in the computation of power dissipation at that transistor. (See Table 1.)
4. The Pin-Order in which the pins of the device under test must be netlisted for purposes of simulation. For example, a BJT device may require netlisting with the Pin-Order "C (Collector) B (Base) E (Emitter)." Depending on the requirements of the simulation tool employed, netlisting in a different order may very well produce erroneous results. An example is shown in Table 2, wherein SMOKE models are associated with discrete devices, and their test node mapping.

5. Identification of the MOC's of the device under test by which to reference the results of simulation. This identification of MOC's must correlate to the SMOKE-Tests specifically identified for the discrete device.
6. An identification or description of a suitable simulation model of the discrete device for purposes of simulation, if it is an active device. Passive devices such as resistors, inductors, and capacitors may not require a detailed simulation model as they may be expressed directly as quantitative values.
7. Specification of Derating Factors, such as reliability-factors and temperature-derating-slopes which are to be parametrically applied to the applicable MOC's to ascertain actual safe operating ranges. For example, maximum power handling capacity of a resistor may be rated at 1 W, at 25° C. Beyond 50° C. in temperature, the maximum power handing capacity of the same resistor may degrade by 0.01 W for every degree C. rise in temperature. Such degradations must be accounted for by applying the appropriate derating factors where necessary.
8. Specification of Tolerances for certain predetermined operational parameters consistent with the SMOKE-tests to be run, so as to ensure that worst-case conditions are properly considered for stress assessment.
9. Identification of the Device Technology for the digital devices to be modeled by IO buffers, so that the appropriately-configured IO buffer models are utilized.

TABLE 1

Example of Code Defining Stress-Tests
and their Mapping to Device Terminals ( "IMINUS" )
   ("test" "current_test" )
   ("term" TERM_NEG)
)
( "IPLUS")
   ("test" "current_test" )
   ("term" TERM_POS)
)
( "IOUT"
   ("test" "current_test" )
   ("term" TERM_OUT)
)
( "VDIFF")
   ("test" "abs_voltage_test" )
   ("nodes"
     (NODE_POS)
     (NODE_ NEG)
   )
)
( "VMMAX"
   ("test" "voltage_test" )
   ("nodes"
     (NODE_NEG)
     (NODE_VCC)
   )
)
( "VMMIN"
   ("test" "voltage_test" )
   ("nodes"
     (NODE VEE)

TABLE 2

Example of SMOKE Model Association with Discrete Devices

| Name | Smoke Model | Edit | Node | Port | Port Order |
|---|---|---|---|---|---|
| MBRD835L_DFM_S | npn | → | TERM_IC | C | |
| CONN102276203_3 | | | | | |
| CONN201082570_C | | | TERM_IB | B | |
| CBT6810_SSOP | | | | | |
| CBT6820_SSOP | | | NODE_VC | C | 1 |
| TTL3306_SSOP | | | | | |
| CONN201082569_C | | | NODE_VB | B | 2 |
| TTL14_SOIC | | | | | |
| TTL07_DIPSOIC | | | NODE_VE | E | 3 |
| MIC2590_TQFP | | | | | |

Figure 4B:
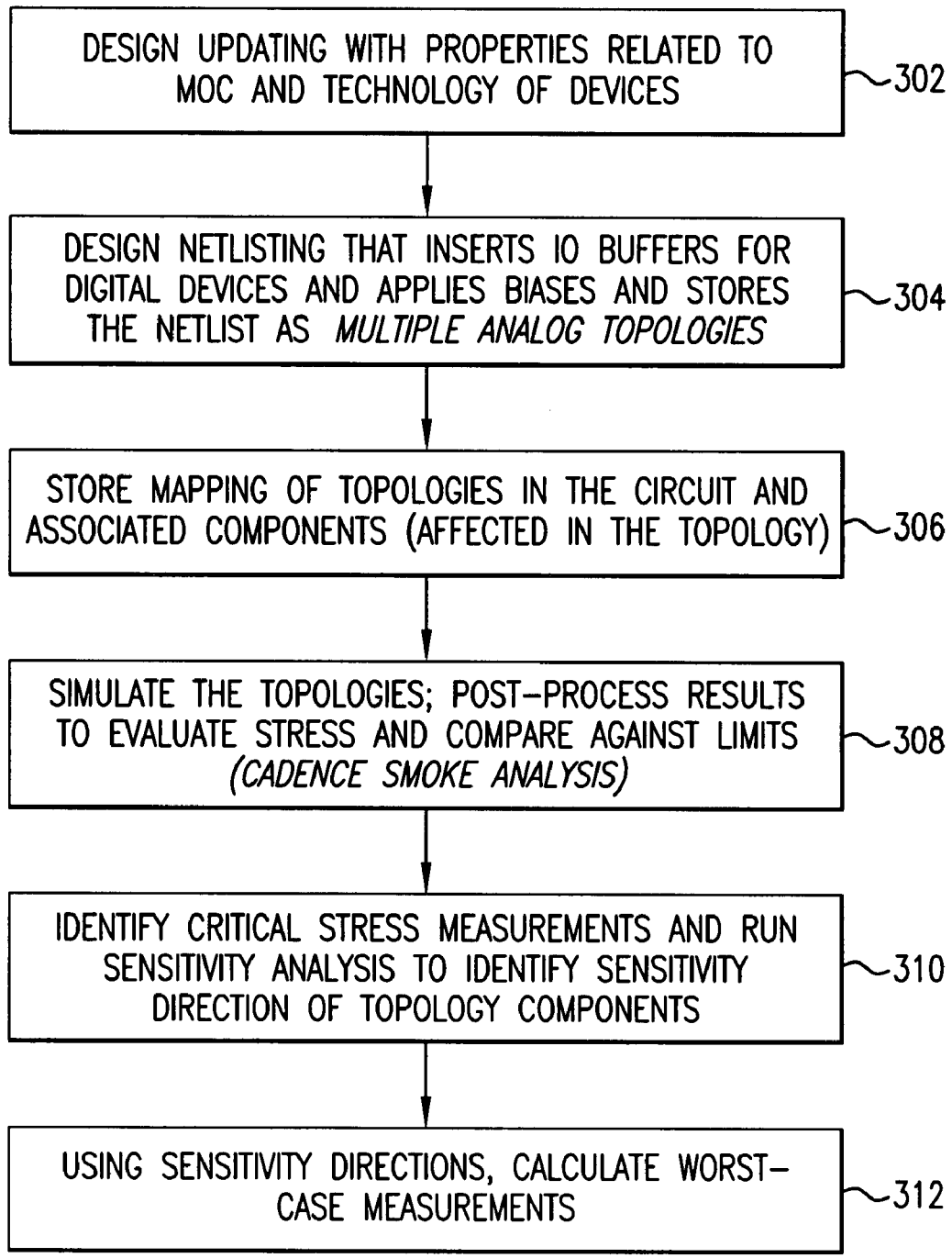
FIG. 4B is a flow diagram illustrating a method flow in accordance with one exemplary embodiment of the present invention.

The flow next proceeds in FIG. 4B to block 304 where appropriate design netlisting operations are preferably executed to selectively insert in place of digital devices one or more subcircuits having the IO buffer instantiations appropriately configured therefor. IO buffer models of the type used, for instance, in known IBIS (Input Output Buffer Information Specification) techniques for signal integrity analysis are preferably employed. Those nets in the instantiated IO buffer model connected to a supply are correspondingly coupled to voltages consistent with the technology of the device at hand.

The type of information analyzed for comprehensive evaluation of the stress endured by analog components under DC operating conditions includes I-V data pertaining to pullup, pulldown, power, and ground clamps. For comprehensive stress evaluation under transient conditions, the requisite information includes V-time data. The required IO buffer model instantiation (selected based on the technology of the buffer) is incorporated in an appropriate subcircuit which serves effectively as substitute for the given digital device, whereby the full range of data necessary for comprehensive evaluation may be obtained by simulation.

In the re-defined analog topology, certain pins of substituted digital device may serve as current drivers while others may serve as current sinks, depending on the operating conditions. Often, it is not immediately apparent what combinations of such effective pin functions correlate to worst-case stress. The operating conditions are preferably controlled in scheduled manner for that reason so that all combinations of states are systematically evaluated. In accordance with one scheduling approach, for example, the IO buffers are swept through their HIGH, LOW, and TRISTATE states.

To sufficiently prepare the given netlist for analog simulation in accordance with the present invention, all digital devices are replaced by one or more subcircuits containing the appropriate IO buffer instantiation. As mentioned in preceding paragraphs, the IO buffer instantiation is based on the digital device's technology property. The IO buffer model employed in this regard is preferably selected where possible from a standard library (such as in the storage unit 106 illustrated in FIG. 4A) of IBIS models, referenced by the given digital device's technologies. Where the relevant device technologies do not sufficiently correspond to that of a model contained in the standard library, the IO buffer model may be alternatively constructed based upon information such as: the device's technology properties (open drain, TTL, or the like); the effective state (HIGH, LOW, TRISTATE, BOTH_ON); the threshold values and rise-fall times of parameters pertinent to transient analysis; and, the applicable input/output load currents. Properties and values pertaining to digital device pins would take precedence in this IO buffer modeling process over those properties and values pertaining more generally to the device.

To further prepare the given circuit topology for analog simulation, source voltages would be treated as bias signals. Additionally, any net which remains floating would be pulled down to ground through a suitably high resistance value.

The analog topologies and associated components obtained at block 304 are stored in a suitable storage medium at block 306 for access during simulation and post processing/analysis of its results. At block 308, the analog simulation of the topologies and postprocessing of the results are carried out to evaluate the extent by which the identified components of the topologies are stressed relative to permissible limits. A SMOKE analysis or other analytical tool known in the art is used in conjunction with the given simulation tools in this regard.

As part of SMOKE analysis, the output of transient stage simulation is examined to determine safe operating limits for the various stress parameters of interest in light of the MOC's and thermal resistance characteristics specified by the manufacturers of the given discrete devices. Those devices for which the safe operating limits (SOL's) of one or more stress parameters is exceeded are flagged for violation. That is, the devices are flagged for extending beyond their safe operating area (SOA).

The stress analysis tool carries out a series of stress tests to compute the actual operating condition values from transient data and compares against the applicable SOL's. The actual operating condition values which exceed the safe operating limits are appropriately flagged; and, the SOL for each operating condition in question is compared with the actual corresponding value obtained from simulated transient operation. The stress analysis tool determines from this whether the device is in fact operating within its SOA.

Figure 5:
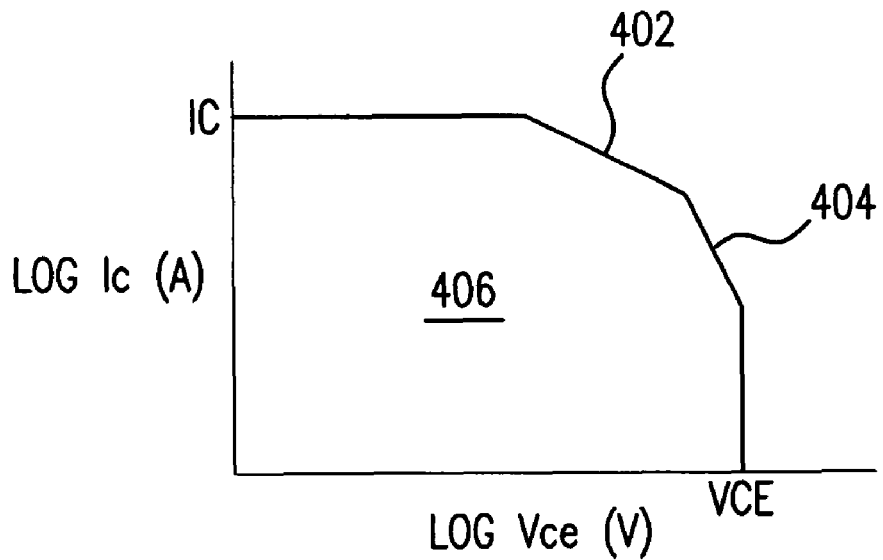
FIG. 5 is a graphic representation illustrating safe operating limits and a safe operating area defined thereby pertaining to an electronic component.

Passive components have SOA's typically defined by one or two MOC's. Active components on the other hand have SOA's typically defined by four or more MOC's. FIG. 5 illustrates a characteristic SOA 406 for an exemplary BJT device, wherein the variation of collector current ($I_C$) is graphically represented with respect to collector-emitter voltage ($V_{CE}$). Maximum power dissipation and secondary breakdown limits 402, 404 cooperatively bound the SOA 406 of the BJT device.

Figure 6:
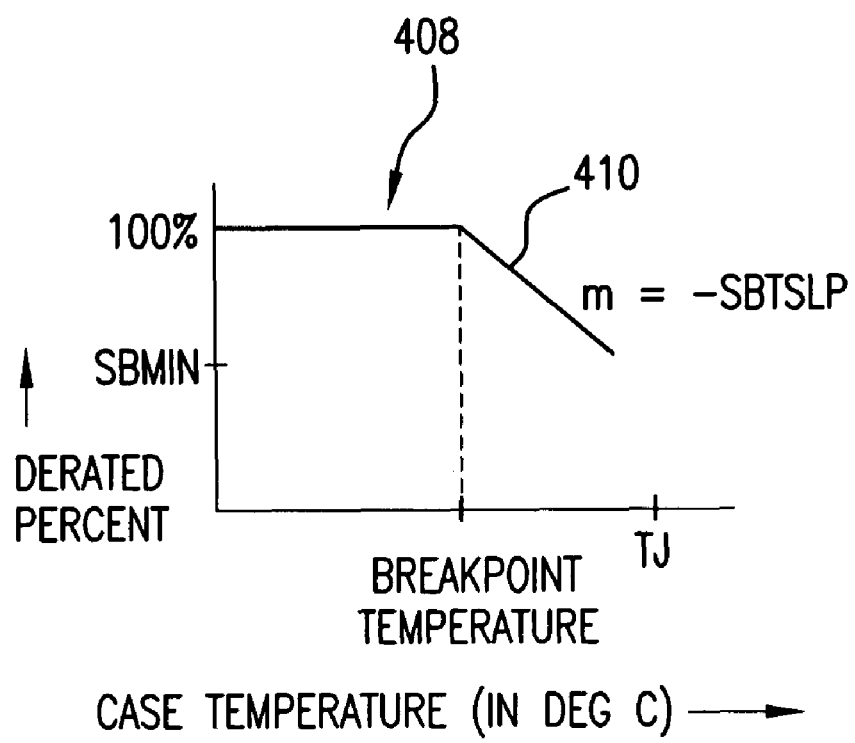
FIG. 6 is a graphic representation of a temperature derating curve illustratively pertaining to an electronic component.

Interdependencies between device parameters are accounted for implicitly during calculation of the parameters' respective SOL's. Similarly, the effects of temperature are implicitly taken into account through an inherent temperature derating capability such as illustrated in FIG. 6. The temperature derating curve there shown illustrates a secondary breakdown for the BJT device. The stress analysis tool derives the temperature derated secondary breakdown limits by initially calculating preliminary limits and accordingly applying the appropriate derating thereto based upon the device's case temperature.

Figure 7:
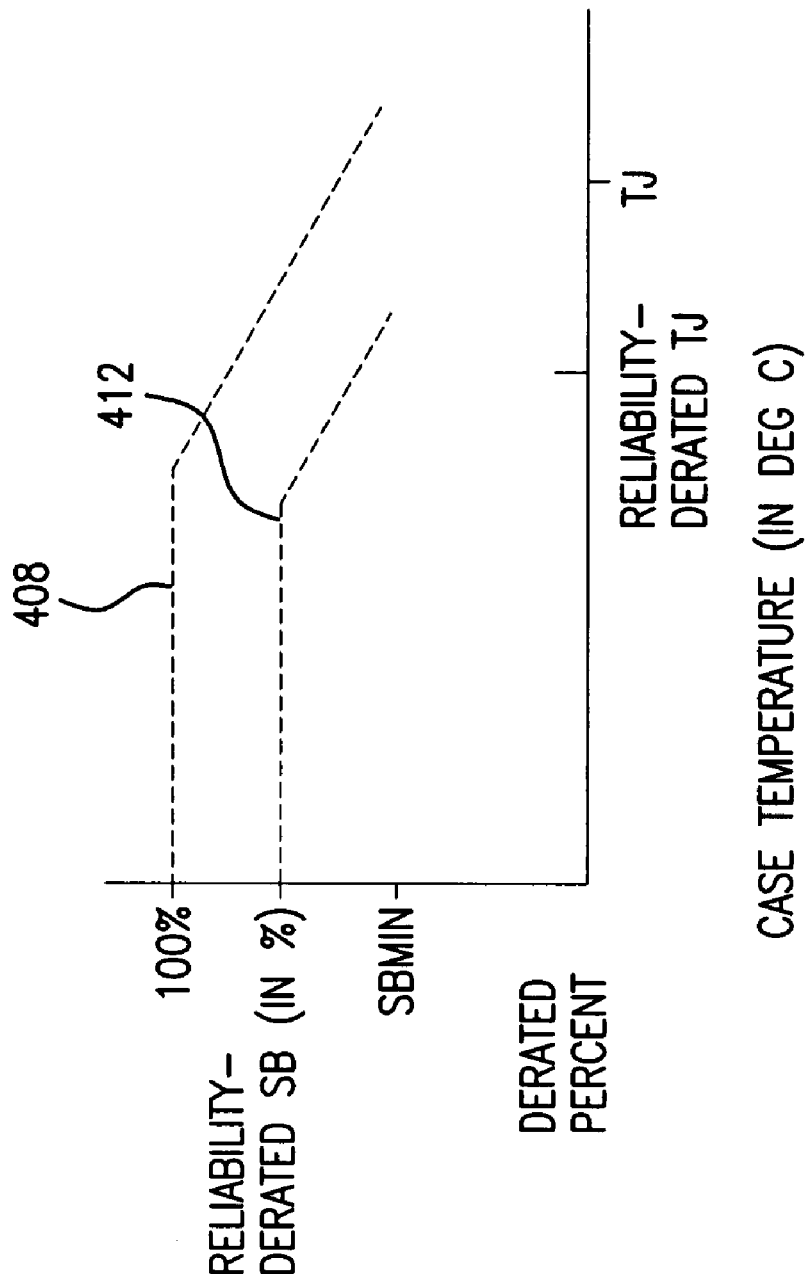
FIG. 7 is a graphic representation of the curve shown in FIG. 6, illustrating the effects of reliability-derating; and, FIG. 8 is a schematic diagram illustrating the extraction of a circuit portion for re-definition in accordance with an exemplary embodiment of the present invention.

The 100% limit shown on the derated percent scale represents the maximum secondary breakdown limit which the BJT device can actually tolerate. As the temperature increases beyond a breakpoint temperature, the secondary breakdown limit 410 begins to decrease at a slope m=−SBTSLP. This decrease of the secondary breakdown limit cannot continue beyond the minimum secondary breakdown limit of SBMIN, as the junction temperature limit TJ is reached at that point. If available, a secondary breakdown derating factor SB may be applied to the maximum secondary breakdown value to assign a reliability derating. The effect of this on the temperature derating curve 408 illustrated in FIG. 6 is to shift it to the reliability-derated version 412, as illustrated in FIG. 7.

Turning back to FIG. 4B, at block 310 of the illustrated flow, the most critical of stress measurements are identified, and a sensitivity analysis is conducted to identify the sensitivity directions of those components within an analog topology affecting the stress measurements of the critical devices. That is, the appropriate one of the limits bounding each applicable tolerance range tending to maximize overall stress inducing conditions is properly identified. Such sensitivity directions are then used in calculating the worst-case stress measurements at block 312.

Note in this regard that worst-case stress measurements cannot be reliably obtained without fully considering the tolerance ranges of the components being stressed. This requires simulation runs to be made for all possible combinations of the applicable parametric values, respectively factoring in the tolerance limits of all the various components in the circuit design. Given that digital electronic circuits of even modest complexity may easily include well over a thousand components, the number of required simulation sweeps would exceed $2^{1000}$ combinations, even if the tolerance ranges for each of those components were taken very simply to span just two different values. While Monte Carlo or other such methods may be employed to reduce the number of simulation sweeps, the results then would not be sufficiently exhaustive.

As described in preceding paragraphs, the problem is advantageously addressed in accordance with one aspect of the present invention, in that a complex digital electronic circuit is effectively decomposed into smaller analog topologies each suitable for analog simulation one independent of the other. Each analog topology presents a dramatically more manageable number of components to be evaluated for stress, thereby necessitating far less simulation sweeps for a given topology than would otherwise be required to evaluate the circuit design in its entirety.

Figure 8:
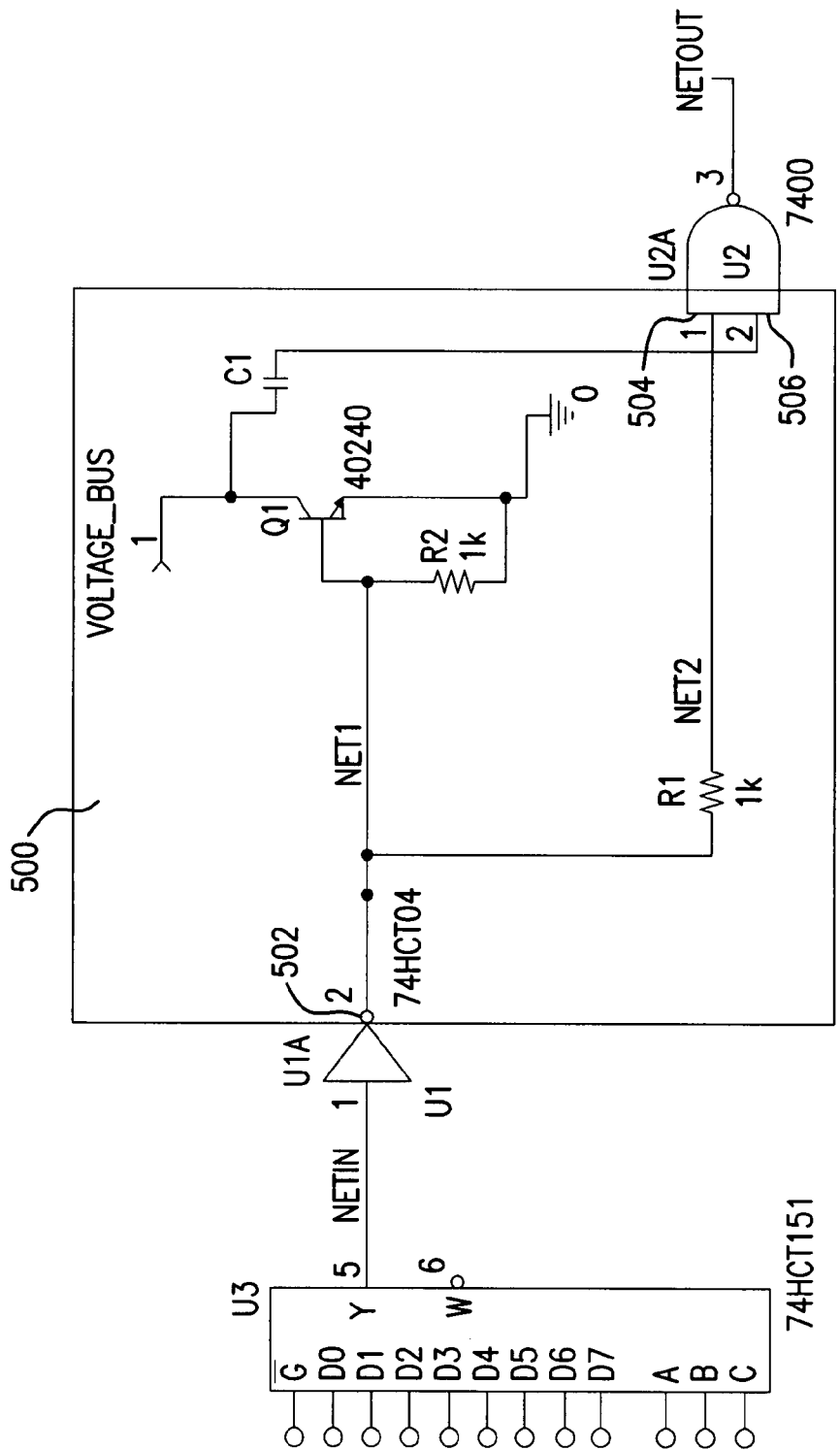

FIG. 8 illustrates another example of a circuit portion 500 containing a capacitor C1, resistors R1, R2, and a BJT Q1 requiring stress measurements. In accordance with another aspect of the present invention, analog simulation would occur on a corresponding analog topology, wherein IO buffer models are employed at the points of interconnection 502, 504, 506 between nodes of the circuit portion 500 and digital devices U1 and U2 as described in preceding paragraphs. A worst-case stress measurement may be obtained for such analog topology as follows. Those components having stress measurement values falling within a predetermined proportion of their rated values, preferably 90%, are identified as candidates for worst-case testing. For each critical device candidate, the analog topology it belongs to is ascertained. If, for instance, a critical device candidate belonged to the analog topology represented in FIG. 8, one of the nets, such as NET1, would be selected toward this end, and all the instances (U1, R1, R2, Q1) connected thereto would be identified as such. With any digital devices (U1) eliminated from further consideration, the remaining instances are identified for further processing, along with all other nets which may be connected in turn to these instances. Any nets connected to voltage biases or ground are eliminated from further consideration, such that in the example of FIG. 8, NET2 is the only net other than NET1 remaining for further processing. This process is continued in this manner until all nets in the analog topology are exhausted, whereby all the interconnected analog components of the topology and terminating either at voltage biases or digital IO buffers are fully identified.

The sensitivity analysis is then carried out on each candidate device's analog topology. Available tolerance information is used to determine the sensitivity directions of those components in the topology tending to affect the candidate device's stress measurements. A positive or negative directional correlation is thereby obtained between the candidate device's parametric variation and that of the other components coexisting in the analog topology.

Based on the sensitivity direction information for the neighboring components, then, the correct tolerance limit value is selected for each component in the topology. The worst-case stress measurement value for the candidate device is calculated in light of this combination of tolerance limit values.

Where available, the analog simulation is run with parasitics (derived from printed circuit board layout traces or other sources) annotated to the topologies' nets. This yields even more realistic stress computations, more closely reflecting actual operating conditions.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of flows or processing steps may be reversed or interposed, all without departing from the spirit or scope of the invention as defined in the appended Claims.

What is claimed is:

1. A method of automatically evaluating stress upon discrete analog components embedded in a digital electronic circuit design of a Printed Circuit Board (PCB) comprising:
   (a) establishing a circuit definition of the digital electronic circuit design of a PCB stored in a computer readable form;
   (b) partitioning said circuit definition into a plurality of circuit portions;
   (c) re-defining said circuit portions to form a plurality of analog topologies adapted for automatic independent analog simulation, including selectively making substitutions for digital components in each said circuit portion with at least one subcircuit incorporating a corresponding instantiation of an input output (IO) buffer model;
   (d) executing said automatic analog simulation upon said analog topologies in a computer based unit to generate simulated results data; and,
   (e) automatically postprocessing the simulated results data to generate worst-case stress measurement data for one or more critical components identified in said analog topologies.

2. The method as recited in claim 1, further comprising updating said circuit definition with operational information corresponding to at least one electronic component of the digital electronic circuit design.

3. The method as recited in claim 2, wherein said operational information includes for said electronic component at least one of: a type classification, a stress test identification, a test pin identification, a pin-order designation, a set of maximum operating condition values, a component model for simulation, a derating factor, a set of tolerance values, and a device technology parameter.

4. The method as recited in claim 1, wherein said instantiation of the IO buffer model is configured in accordance with an Input Output Buffer Information Specification (IBIS) standard.

5. The method as recited in claim 1, wherein said instantiation of the IO buffer model is selected from a library of prestored models according to a technology parameter of said digital component to be substituted.

6. The method as recited in claim 1, wherein said instantiation of the IO buffer model is generated according to a plurality of parametric factors of said digital component to be substituted, said parametric factors including a technology parameter, a state parameter, a transient state behavior parameter, and a load current parameter.

7. The method as recited in claim 1, wherein said automatic analog simulation executes a simulation tool, and said postprocessing is executed at least in part by a stress analysis tool.

8. The method as recited in claim 1, wherein said automatic analog simulation is executed to sweep each said instantiation of the IO buffer model through all operational states thereof, including HIGH, LOW, and TRISTATE.

9. The method as recited in claim 1, wherein each said partitioned circuit portion includes a partial netlisting of the digital electronic circuit design.

10. The method as recited in claim 1, wherein said automatic analog simulation generates said simulated results data to include transient state behavior for said analog topologies, and said postprocessing automatically generates said worst-case stress measurement data responsive thereto.

11. The method as recited in claim 1, wherein all said digital components in each said circuit portion is substituted with at least one said subcircuit incorporating a corresponding input output (IO) buffer model.

12. The method as recited in claim 1, wherein the method is programmably encoded in a non-transitory computer readable medium for automatically evaluating stress upon discrete analog components embedded in a digital electronic circuit design of a PCB.

13. A system for automatically evaluating stress upon discrete analog components embedded in a digital electronic circuit design of a Printed Circuit Board (PCB) comprising:
   a circuit definition unit operable to generate a circuit definition of the digital electronic circuit design of a PCB stored in a computer readable form;
   a circuit re-definition unit coupled to said circuit definition unit operable to partition said circuit definition into a plurality of circuit portions, said circuit re-definition unit re-defining said circuit portions to form a plurality of analog topologies adapted for automatic analog simulation one independent of the other, said circuit re-definition unit selectively substituting all digital components in each said circuit portion with at least one subcircuit including instantiation of an input output (IO) buffer model corresponding thereto;
   a simulation unit coupled to said circuit re-definition unit configured to execute automatic analog simulation upon said analog topologies in a computer based unit to generate simulated results data; and,
   a stress analysis unit coupled to said simulation unit configured to automatically postprocess the simulated results data to generate worst-case stress measurement data for one or more critical components identified in said analog topologies.

14. The system as recited in claim 13, wherein at least one of said circuit definition and circuit re-definition units is operable to update said circuit definition with operational information corresponding to at least one electronic component of the digital electronic circuit design, the operation information including for said electronic component at least one of: a type classification, a stress test identification, a test pin identification, a pin-order designation, a set of maximum operating condition values, a component model for simulation, a derating factor, a set of tolerance values, and a device technology parameter.

15. The system as recited in claim 13, further comprising a library selectively accessible to said circuit re-definition unit according to a technology parameter of each said digital component to be substituted, said library including a plurality of said IO buffer models configured in accordance with an Input Output Buffer Information Specification (IBIS) standard.

16. The system as recited in claim 13, wherein said instantiation of the IO buffer model is generated by said circuit re-definition unit according to a plurality of parametric factors of said digital component to be substituted, said parametric factors including a technology parameter, a state parameter, a transient state behavior parameter, and a load current parameter.

17. The system as recited in claim 13, wherein said simulation unit is operable to sweep each said instantiation of the IO buffer model through all operational states thereof, including HIGH, LOW, and TRISTATE.

18. The system as recited in claim 13, wherein said circuit re-definition unit partitions each said circuit portion to include a partial netlisting of the digital electronic circuit design.

19. A method of automatically evaluating stress upon discrete analog components embedded in a digital electronic circuit design of a Printed Circuit Board (PCB) comprising:
(a) partitioning a computer readable circuit definition of the digital electronic circuit design of a PCB into a plurality of circuit portions containing digital components stored in a computer readable form; and,
(b) re-defining said circuit portions to a plurality of analog topologies for automatic independent analog simulation, said circuit portion re-definition including selectively making substitutions for each said digital component in said circuit portions with at least one subcircuit incorporating a corresponding input output (IO) buffer model, said analog topologies in a computer based unit being thereby compatible with predetermined automatic analog simulation and automatic postprocessing tools;
whereby worst-case stress measurement data is automatically generated for one or more critical components of the digital electronic circuit design.

20. The method as recited in claim 19, wherein the method is programmably encoded in a non-transitory computer readable medium for automatically evaluating stress upon discrete analog components embedded in a digital electronic circuit design of a PCB.

* * * * *